United States Patent
Pramod et al.

(10) Patent No.: US 10,717,463 B2
(45) Date of Patent: Jul. 21, 2020

(54) FEEDFORWARD CONTROL OF PERMANENT MAGNET SYNCHRONOUS MOTOR DRIVE UNDER CURRENT SENSING FAILURE

(71) Applicant: STEERING SOLUTIONS IP HOLDING CORPORATION, Saginaw, MI (US)

(72) Inventors: Prerit Pramod, Saginaw, MI (US); Varsha Govindu, Saginaw, MI (US); Zhe Zhang, Saginaw, MI (US); Krishna Mohan Pavan Kumar Namburi, Saginaw, MI (US)

(73) Assignee: Steering Solutions IP Holding Corporation, Saginaw, MI (US)

( * ) Notice: Subject to any disclaimer, the term of this patent is extended or adjusted under 35 U.S.C. 154(b) by 0 days.

(21) Appl. No.: 16/177,265

(22) Filed: Oct. 31, 2018

(65) Prior Publication Data
US 2020/0130732 A1    Apr. 30, 2020

(51) Int. Cl.
| H02P 6/16 | (2016.01) |
| B62D 5/04 | (2006.01) |
| G01R 19/00 | (2006.01) |
| B60L 15/02 | (2006.01) |
| H02P 23/14 | (2006.01) |

(52) U.S. Cl.
CPC .......... B62D 5/0484 (2013.01); B60L 15/025 (2013.01); B62D 5/0463 (2013.01); G01R 19/0092 (2013.01); H02P 23/14 (2013.01); H02P 2205/01 (2013.01); H02P 2207/05 (2013.01)

(58) Field of Classification Search
CPC .............................. B62D 5/0484; B60L 15/025
USPC ..................................................... 318/400.04
See application file for complete search history.

(56) References Cited

U.S. PATENT DOCUMENTS

| 6,900,607 | B2 | 5/2005 | Kleinau et al. | |
| 7,091,684 | B2* | 8/2006 | Kobayashi | B62D 5/046 |
| | | | | 318/139 |
| 7,199,549 | B2 | 4/2007 | Kleinau et al. | |
| 7,576,506 | B2 | 8/2009 | Kleinau et al. | |
| 2009/0079373 | A1* | 3/2009 | Nagase | H02P 6/28 |
| | | | | 318/400.22 |
| 2012/0271513 | A1* | 10/2012 | Yoneda | B62D 5/0484 |
| | | | | 701/41 |
| 2012/0274260 | A1* | 11/2012 | Takahashi | B62D 5/0487 |
| | | | | 318/490 |

* cited by examiner

*Primary Examiner* — Erick D Glass
(74) *Attorney, Agent, or Firm* — Dickinson Wright PLLC

(57) ABSTRACT

According to one or more embodiments, an example system includes a motor, and a motor control system that includes a low side current measurement subsystem. The system further includes a processor that switches the motor control system to use feedforward current control in response to detecting a current measurement failure in the low side current measurement subsystem. The processor further identifies a first phase that has a failed current measurement. The processor also computes a current measurement for the first phase, which has the current measurement failure. The processor further uses the computed current measurement to compute a parameter estimate.

17 Claims, 6 Drawing Sheets

FEEDFORWARD CONTROL OF PERMANENT MAGNET SYNCHRONOUS MOTOR DRIVE UNDER CURRENT SENSING FAILURE

BACKGROUND

Typically, a motor control system, such as in an electric power steering (EPS) system, controls an electric motor by applying voltage to the electric motor. For example, an EPS system uses the electric motor to provide steering assist to an operator of a steering wheel of a vehicle using a method of torque control. When using a permanent magnet synchronous machine (PMSM), field oriented control (FOC) is utilized to allow the alternating current (AC) three-phase motor voltage and current signals to be transformed into a synchronously rotating reference frame, commonly referred to as the d/q axis reference frame. In a d/q axis reference frame, the motor voltages and currents become direct current (DC) quantities. The FOC torque control technique is commonly implemented either using feedforward methods of control or a closed loop current feedback control.

When the FOC torque control is implemented through a closed loop current control, the implementation employs high performance current controllers that minimize the error between commanded and measured currents to achieve perfect current tracking. Thus, current control requires the motor currents to be measured, which is typically achieved by measuring the phase currents of the electric machine, which are then transformed into the synchronous frame via the Park Transform to perform the control in the synchronous reference frame.

Accordingly, it is desirable to have motor control systems to have fault tolerant current measurement strategies in case of a fault/loss of one or more current measurement sensors, or other equipment used for measuring the current values. However, feedforward current control, which is the mode of operation of motor control systems with current sensing failures, is not as consistent and accurate as feedback current control, particularly due to its sensitivity to motor control parameter estimates. Thus, under feedforward control operation, it is desirable to implement control techniques that provide have higher accuracy and consistency of the feedforward control behavior.

SUMMARY

According to one or more embodiments, an example system includes a motor, and a motor control system that includes a low side current measurement subsystem. The system further includes a processor that switches the motor control system to use feedforward current control in response to detecting a current measurement failure in the low side current measurement subsystem. The processor further identifies a first phase that has a failed current measurement. The processor also computes a current measurement for the first phase, which has the current measurement failure. The processor further uses the computed current measurement to compute a parameter estimate.

According to one or more embodiments, an example computer implemented method includes switching a current controller to use feedforward current control in response to detecting a current measurement failure in a low side current measurement subsystem of a motor control system. The method further includes identifying a first phase that has the current measurement failure. The method further includes computing a current measurement for the first phase, which has the current measurement failure. The method further includes computing a parameter estimate of the motor control system using the computed current measurement.

According to one or more embodiments, an example steering system includes a motor control system that includes a low side current measurement subsystem. The steering system further includes a processor that switches the motor control system to use feedforward current control in response to detecting a current measurement failure in the low side current measurement subsystem. The processor further identifies a first phase that has a failed current measurement. The processor also computes a current measurement for the first phase, which has the current measurement failure. The processor further uses the computed current measurement to compute a parameter estimate.

These and other advantages and features will become more apparent from the following description taken in conjunction with the drawings.

BRIEF DESCRIPTION OF THE DRAWINGS

The subject matter of the present disclosure is particularly pointed out and distinctly claimed in the claims at the conclusion of the specification. The foregoing and other features, and advantages of the present disclosure are apparent from the following detailed description taken in conjunction with the accompanying drawings in which:

DETAILED DESCRIPTION

As used herein the terms module and sub-module refer to one or more processing circuits such as an application specific integrated circuit (ASIC), an electronic circuit, a processor (shared, dedicated, or group) and memory that executes one or more software or firmware programs, a combinational logic circuit, and/or other suitable components that provide the described functionality. As can be appreciated, the sub-modules described below can be combined and/or further partitioned.

It should be noted that technical solutions are described herein with reference to specific embodiments, with references to one or more figures without limiting the same, and it is to be understood that the disclosed embodiments are merely illustrative of the technical solutions that may be embodied in various and alternative forms. The figures are not necessarily to scale; some features may be exaggerated or minimized to show details of particular components.

Therefore, specific structural and functional details disclosed herein are not to be interpreted as limiting, but merely as a representative basis for teaching one skilled in the art to variously employ the present disclosure.

Figure 1:
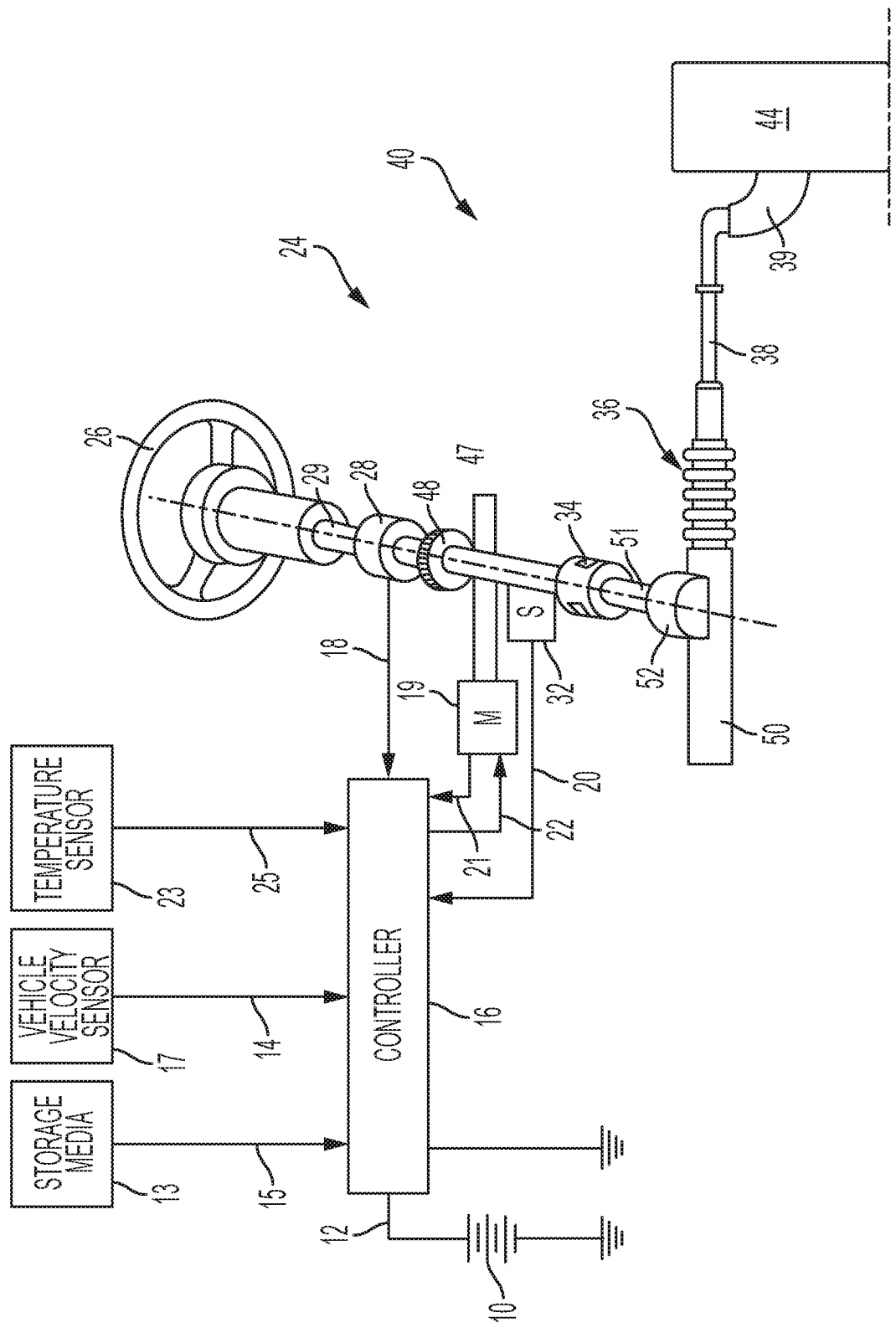
FIG. 1 is an exemplary embodiment of an EPS system according to one or more embodiments.

Referring now to the Figures, where the technical solutions will be described with reference to specific embodiments, without limiting same, FIG. 1 is an exemplary embodiment of an electric power steering system (EPS) 40 suitable for implementation of the disclosed embodiments. The steering mechanism 36 is a rack-and-pinion type system and includes a toothed rack (not shown) within housing 50 and a pinion gear (also not shown) located under gear housing 52. As the operator input, hereinafter denoted as a steering wheel 26 (e.g. a hand wheel and the like) is turned, the upper steering shaft 29 turns and the lower steering shaft 51, connected to the upper steering shaft 29 through universal joint 34, turns the pinion gear. Rotation of the pinion gear moves the rack, which moves tie rods 38 (only one shown) in turn moving the steering knuckles 39 (only one shown), which turn a steerable wheel(s) 44 (only one shown).

Electric power steering assist is provided through the control apparatus generally designated by reference numeral 24 and includes the controller 16 and an electric machine 46, which could be a permanent magnet synchronous motor, a permanent magnet direct current motor, a switched reluctance motor, or any other type of motor, are is hereinafter denoted as motor 46. The controller 16 is powered by the vehicle power supply 10 through line 12. The controller 16 receives a vehicle speed signal 14 representative of the vehicle velocity from a vehicle velocity sensor 17. Steering angle is measured through position sensor 32, which may be an optical encoding type sensor, variable resistance type sensor, or any other suitable type of position sensor, and supplies to the controller 16 a position signal 20. Motor velocity may be measured with a tachometer, or any other device, and transmitted to controller 16 as a motor velocity signal 21. A motor velocity denoted $\omega_m$ may be measured, calculated or a combination thereof. For example, the motor velocity $\omega_m$ may be calculated as the change of the motor position $\theta$ as measured by a position sensor 32 over a prescribed time interval. For example, motor speed $\omega_m$ may be determined as the derivative of the motor position $\theta$ from the equation $\omega_m = \Delta\theta/\Delta t$ where $\Delta t$ is the sampling time and $\Delta\theta$ is the change in position during the sampling interval. Alternatively, motor velocity may be derived from motor position as the time rate of change of position. It will be appreciated that there are numerous well-known methodologies for performing the function of a derivative.

As the steering wheel 26 is turned, torque sensor 28 senses the torque applied to the steering wheel 26 by the vehicle operator. The torque sensor 28 may include a torsion bar (not shown) and a variable resistive-type sensor (also not shown), which outputs a variable torque signal 18 to controller 16 in relation to the amount of twist on the torsion bar. Although this is one type of torque sensor, any other suitable torque-sensing device used with known signal processing techniques will suffice. In response to the various inputs, the controller sends a command 22 to the electric motor 46, which supplies torque assist to the steering system through worm 47 and worm gear 48, providing torque assist to the vehicle steering.

It should be noted that although the disclosed embodiments are described by way of reference to motor control for electric steering applications, it will be appreciated that such references are illustrative only and the disclosed embodiments may be applied to any motor control application employing an electric motor, e.g., steering, valve control, and the like. Moreover, the references and descriptions herein may apply to many forms of parameter sensors, including, but not limited to torque, position, speed and the like. It should also be noted that reference herein to electric machines including, but not limited to, motors, hereafter, for brevity and simplicity, reference will be made to motors only without limitation.

In the control system 24 as depicted, the controller 16 utilizes the torque, position, and speed, and like, to compute a command(s) to deliver the required output power. Controller 16 is disposed in communication with the various systems and sensors of the motor control system. Controller 16 receives signals from each of the system sensors, quantifies the received information, and provides an output command signal(s) in response thereto, in this instance, for example, to the motor 46. Controller 16 is configured to develop the necessary voltage(s) out of inverter (not shown), which may optionally be incorporated with controller 16 and will be referred to herein as controller 16, such that, when applied to the motor 46, the desired torque or position is generated. Because these voltages are related to the position and speed of the motor 46 and the desired torque, the position and/or speed of the rotor and the torque applied by an operator are determined. A position encoder is connected to the steering shaft 51 to detect the angular position $\theta$. The encoder may sense the rotary position based on optical detection, magnetic field variations, or other methodologies. Typical position sensors include potentiometers, resolvers, synchros, encoders, and the like, as well as combinations comprising at least one of the forgoing. The position encoder outputs a position signal 20 indicating the angular position of the steering shaft 51 and thereby, that of the motor 46.

Desired torque may be determined by one or more torque sensors 28 transmitting torque signals 18 indicative of an applied torque. One or more exemplary embodiments include such a torque sensor 28 and the torque signal(s) 18 therefrom, as may be responsive to a compliant torsion bar, T-bar, spring, or similar apparatus (not shown) configured to provide a response indicative of the torque applied.

In one or more examples, a temperature sensor(s) 23 located at the electric machine 46. Preferably, the temperature sensor 23 is configured to directly measure the temperature of the sensing portion of the motor 46. The temperature sensor 23 transmits a temperature signal 25 to the controller 16 to facilitate the processing prescribed herein and compensation. Typical temperature sensors include thermocouples, thermistors, thermostats, and the like, as well as combinations comprising at least one of the foregoing sensors, which when appropriately placed provide a calibratable signal proportional to the particular temperature.

The position signal 20, velocity signal 21, and a torque signal(s) 18 among others, are applied to the controller 16. The controller 16 processes all input signals to generate values corresponding to each of the signals resulting in a rotor position value, a motor speed value, and a torque value being available for the processing in the algorithms as prescribed herein. Measurement signals, such as the above mentioned are also commonly linearized, compensated, and filtered as desired to enhance the characteristics or eliminate undesirable characteristics of the acquired signal. For example, the signals may be linearized to improve processing speed, or to address a large dynamic range of the signal. In addition, frequency or time based compensation and filtering may be employed to eliminate noise or avoid undesirable spectral characteristics.

In order to perform the prescribed functions and desired processing, as well as the computations therefore (e.g., the identification of machine parameters, control algorithm(s), and the like), controller 16 may include, but not be limited to, a processor(s), computer(s), DSP(s), memory, storage, register(s), timing, interrupt(s), communication interface(s), and input/output signal interfaces, and the like, as well as combinations comprising at least one of the foregoing. For example, controller 16 may include input signal processing and filtering to enable accurate sampling and conversion or acquisitions of such signals from communications interfaces. Additional features of controller 16 and certain processes therein are thoroughly discussed at a later point herein.

Figure 2:
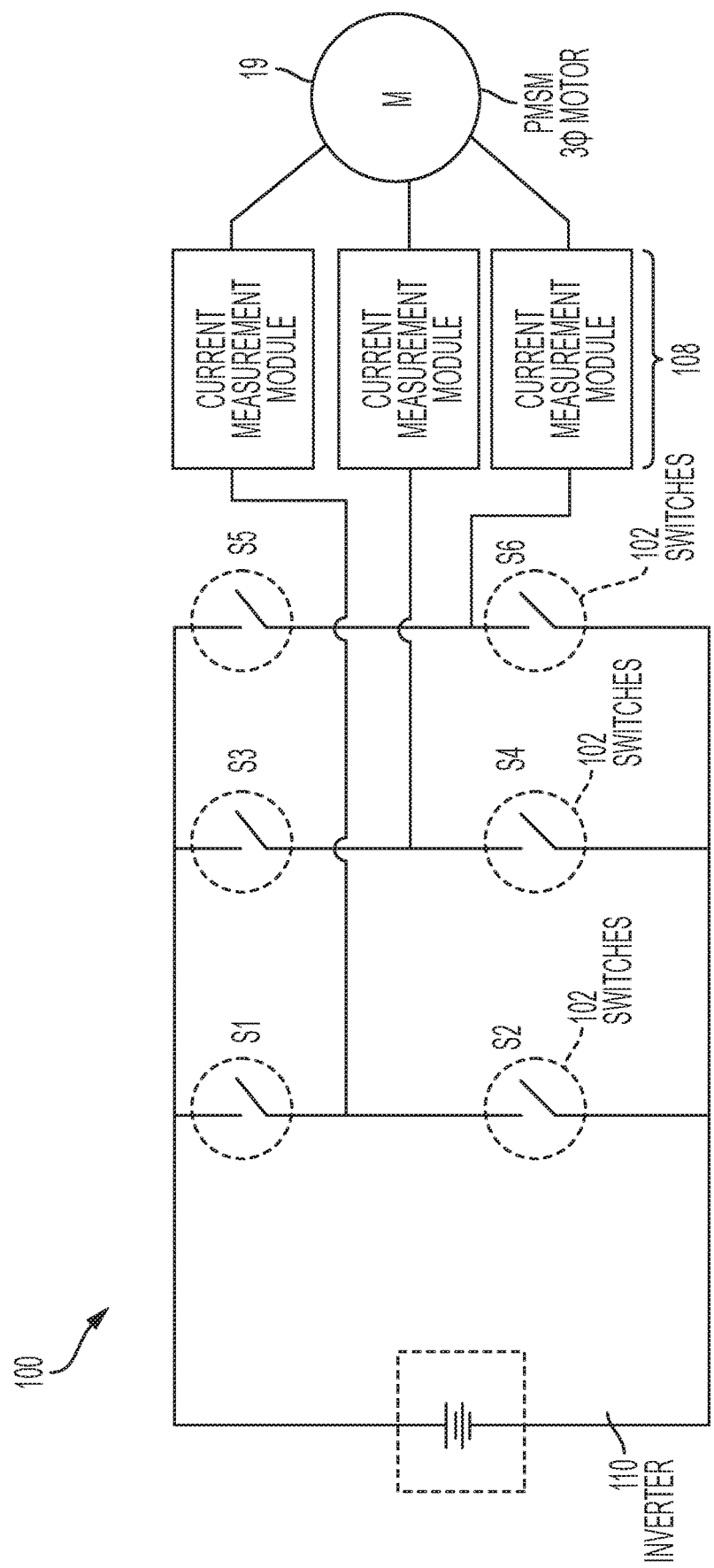
FIG. 2 shows example of inline current measurement for a motor control.

FIG. 2 shows example of inline current measurement for a motor control system. Here, the motor control system 100 includes an inverter module or a power supply 10, switches 102, current measurement modules 108, and a 3-phase motor 19. In inline current measurement, the current measurement modules 108 directly measure the phase currents of the motor 19 as shown in FIG. 2. Note that for measuring the 3 phase currents of a Y-connected or balanced motor, two inline current measurements may be used and the third phase current may be calculated.

Figure 3:
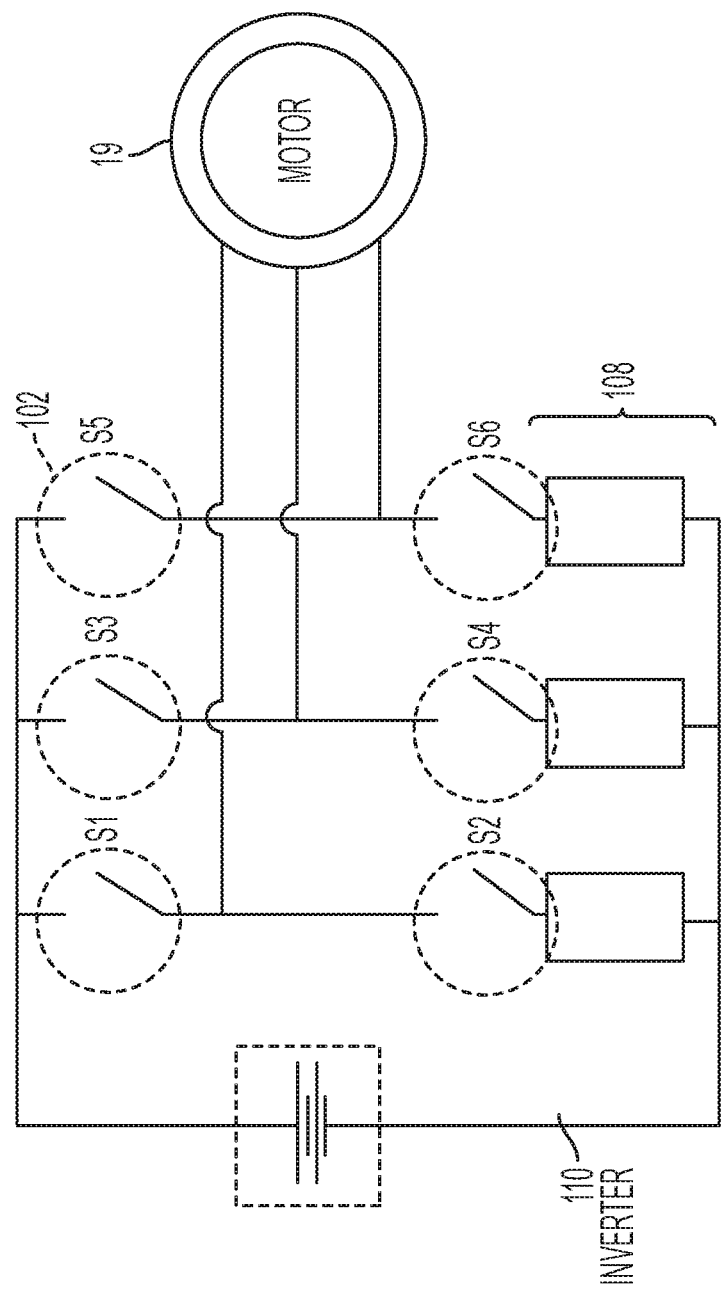
FIG. 3 shows example of low side current measurement for motor control systems according to one or more embodiments.

FIG. 3 shows example of low side current measurement for motor control systems according to one or more embodiments. Here, compared to the inline measurement system of FIG. 2, the current measurement modules 108 measure the current values in each phase leg of the inverter on the low side of the switch circuit that includes the switches 102.

Figure 4:
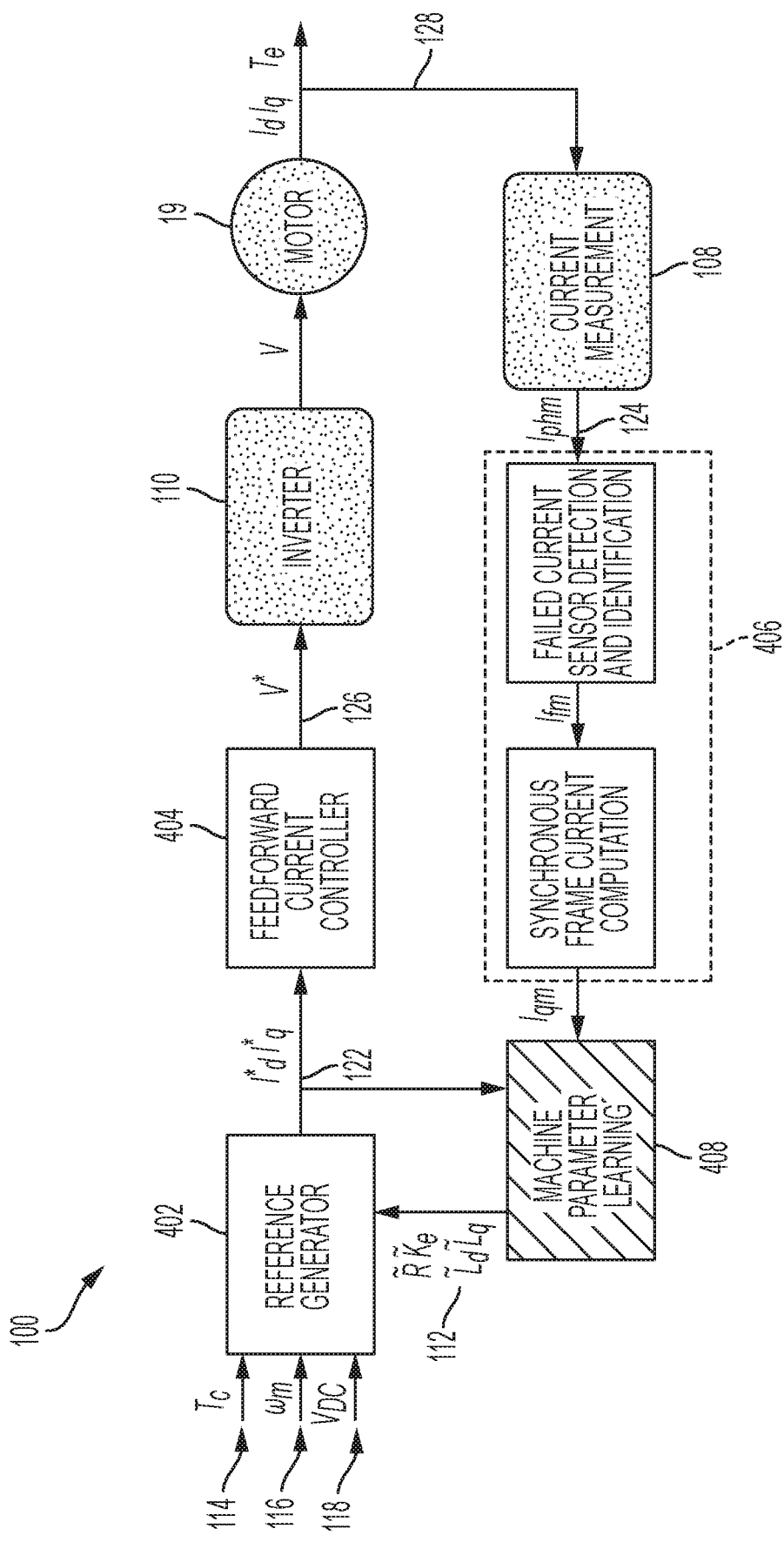
FIG. 4 depicts a block diagram of a the motor control system used to control torque generated using a poly-phase permanent magnet synchronous machine (PMSM) in accordance with some embodiments.

FIG. 4 depicts a block diagram of a motor control system 100 used to control torque generated using a poly-phase permanent magnet synchronous machine (PMSM) using feedforward current control in accordance with some embodiments. As shown, the motor control system 100 includes a reference current generator 402, a feedforward current controller 404, and an inverter 110. FIG. 4 also depicts a motor 19, and a current measurement module 108 that measures current from the motor 19 as well as a current diagnostic and calculation module 406.

The motor reference current generator 402 a current command 122 based on input signals. The input signals may include a motor torque command 114, a motor velocity 116, a source voltage signal 118, and machine parameters 112. The motor torque command 114 represents a commanded torque value ($T_c$), and may be derived from another torque control module (not shown) such as an EPS, autonomous steering or semi-autonomous steering control unit, or may correspond to a torque value generated by an operator. The motor velocity ($\omega_m$) 116 is an angular speed of the motor 19 measured by a speed sensor (not shown). The speed sensor may include, for example, an encoder and a speed calculation circuit for calculating the angular speed of a rotor of the motor 19 based on a signal received by the encoder. In some embodiments, the motor speed can be estimated from motor position. The source voltage signal ($V_{DC}$) 118 represents a bridge voltage from a DC power source (not shown), such as the power supply 10.

The machine parameters 112 are estimated values for the parameters of the motor 19 and the inverter 110, including, for example, a motor constant $K_e$ (Volt/rad/s), a motor circuit resistance R (Ohm), a direct axis inductance $L_d$ (Henry) and a quadrature axis inductance $L_q$ (Henry). The motor circuit resistance refers to the total resistance (per phase for example) of the combination of the motor and the inverter. It should be noted that estimated values are depicted with an accent '~' herein. In one or more examples, the motor control system 100 includes a machine parameter learning module 408 that estimates the machine parameters 112. The estimated machine parameters 112 are fed into the motor reference current generator 402 to continuously operate as described herein. In one or more examples, the machine parameter learning module 408 is part of the controller 16.

In some embodiments, the current command 122 generated by the motor reference current generator 402 includes a reference d-axis current command ($I_d$) and a reference q-axis current command ($I_q$) that are generated based on the motor torque command 114, the source voltage signal 118, and the angular speed. The current command 122 satisfies the motor torque command 114 and the source voltage signal 118.

The current controller 404 determines a final voltage command (V*) 126 based on the feedforward voltage command, the current command 122, and measured motor currents 124. The measured motor currents 124 include a measured d-axis current and a measured q-axis current, which are transformed from the current measurement signals in the stator reference frame in some embodiments.

The current controller 404 sends the final voltage command 126 to control the motor 19. In some embodiments, a polar conversion controller (not shown) receives as inputs the d-axis voltage command and the q-axis voltage command. Based on the inputs, the polar conversion controller determines a voltage command and a phase advance angle. A pulse width modulation (PWM) generation module (not shown) then receives as input signals the voltage command and the phase advance angle from the polar conversion controller. The PWM generation module also receives a motor position or rotor angle value of the motor 19 measured by a motor position sensor (not shown), and generates multi-phase duty cycle values. In some embodiments, the PWM generation module may include a space vector modulation PWM unit that generates three respective duty cycle values. The duty cycle values are used to drive gate drive unit which operates the switches of the inverter 110 in order to energize phases of the motor 19.

The current measurement module 108 measures the actual motor currents 128 and sends values of measured motor currents 124 to the current measurement calculation and diagnostic module 406. In some embodiments, the current measurement module 108 includes current measurement sensors that generate the measured motor currents 124 from the actual currents 128 of the motor 19. The measured motor currents 124 therefore represent the values of phase currents ($I_{phm}$) (e.g. two phase, three phase) measured by the current measurement module 108.

In one or more examples, the current measurement calculation and diagnostics module 406 identifies a specific failed current measurement module 108 based on magnitude and phase values, and outputs suitable notification flags to the controller 16 to adjust or control how the measured motor current 124 is determined in response to detecting a failed current measurement module 108. It should be noted a failed current measurement module 108 can include any of the current measurement modules 108 in the phase a, b, or c. Based on the inputs from the current measurement and diagnostics module 406, the current controller 404 determines whether to use feedforward or feedback control to generate voltage commands to the motor 19.

Typically, in 3-phase current measurement systems, current sensor failures cause either transition to loss of assist mitigation mode or shutdown. For example, when a large offset error occurs in a phase current measurement, the closed loop current control operating in the synchronous reference frame adjusts the motor voltage so that the measurement of motor current matches the command, but because the measurement is incorrect, the actual motor currents become incorrect. The failure mode results in motor position dependent motor torque and current errors, which may be perceived as a large torque ripple at the motor shaft, and potentially larger than rated motor currents (for the hardware design). When the torque ripple caused by the phase current measurement offset error becomes large enough (beyond a threshold), it can produce motor torque in the opposite direction from the motor torque command. When used in an EPS system 12, failures which produce torque in a direction opposite to the desired motor torque command can result in violation of system safety goals or fault management requirements. Technical solutions exist for detecting the offset errors by transforming the motor voltage commands back into the stator reference frame. Further, technical solutions also exist that desensitize the detection scheme to errors in machine parameter estimates and simultaneously improve the detection time.

If the current measurement subsystem in the motor control system 100 is an inline type where the motor phase currents are measured directly (FIG. 2), once single point or multiple point failures are detected in the current measurement subsystem, existing technical solutions facilitate retaining the motor control system 100 in feedback current control for continuing the operation. This is possible in a motor control system where inline current measurements are used (FIG. 2) because two healthy measurements may be used to re-construct the third phase current (using the assumption that the sum of currents for a star-wound motor without a neutral wire is zero) and then perform the d/q transformation under all operating conditions.

However, in the motor control system 100 that uses low side current measurements (FIG. 3) such transition to the feedback current control is not possible because the third current cannot be reconstructed from the two healthy values under all conditions. At high duty cycles (voltage commands), which result in high on-times of the top switches and low on-times of the bottom switches in the inverter phase legs, the time required for sampling the low side measurement is not sufficient. High duty cycles occurs at high modulation indices. In that case, two measurements after a single point failure and failed sensor identification cannot be used to operate the system in feedback current control mode. Accordingly, in such cases, the system 12 that includes the motor control system 100, has to either be shut down or transitioned into a loss of assist mitigation mode, which is feedforward current control in this case (which does not directly utilize current measurements). Because feedforward current control is an open loop control scheme that uses an inverse of the motor (plant) mathematical model, it is sensitive to errors in estimation of the motor control system parameters. Note that the plant also includes the inverter in addition to the motor.

The technical solutions described herein address such technical challenges by facilitating use of healthy current measurements after a current sensor fault detection in a motor control system 100 that uses low side current measurement to enhance the properties of the feedforward control operation through feedback machine parameter learning. Beyond using current measurements to learn parameters (408), the technical solutions described herein facilitate identifying and utilizing healthy current sensors after a fault by imposing one or more conditions for valid current measurement to learn machine parameters. The technical solutions described herein thereby improve the control performance (dynamic and steady state) of feedforward current control. The technical solutions described herein result in a relatively transparent transition into loss of assist mitigation mode from a control performance standpoint after a current measurement module 108 failure in the motor control system 100. Accordingly, the technical solutions described herein improve performance of a motor control system 100, and in turn, an electrical machine, such as the EPS 12, that uses the motor control system.

In the description of the embodiments herein, a technique to enhance feedforward current control after a current sensor failure occurs is presented. Accordingly, it is assumed that the motor current control system is transitioned to feedforward control mode once a current sensor failure is detected. While in the three-phase inline current measurement system (FIG. 2) it is possible to switch back to feedback control mode after specific failure identification, this is not possible in systems where low side current measurements are used (FIG. 3). This is because with only two healthy low side current measurements, the re-construction of phase currents is not possible under all operating conditions. The technical solutions described herein address such technical challenges in low side current measurement and facilitate improving the overall (dynamic as well as steady state) performance of the feedforward current control system by using the remaining current measurements to learn machine parameters (408), and thus, enhance the machine parameter estimation (408). However, note that one or more embodiments described herein are applicable to systems with inline current measurements in which the system operates in feedforward current control mode after a first current measurement failure. Feedforward control utilizes an inverse of (dynamic) model of the motor 19 with estimated parameters to compute the voltage commands that are applied to the motor 19 to generate the desired currents and in turn to generate the desired torque from the motor 19.

Machine parameters learning 408 (feedback parameter estimation techniques) using current measurements obtains the current measurement and converts the current values to the synchronous (d/q) frame. The machine parameter learning 408 further includes minimizing the error between the commanded and measured current to determine the parameter errors, which are then used to correct the base parameter estimates (obtained utilizing the so-called feedforward parameter estimation techniques). However, because the current measurements for the motor control system 100 that uses low side current measurement (FIG. 3) are only valid in particular operating regions, an additional check for determining the validity of current measurements is also performed as described herein when performing the machine parameter learning.

It should be noted that current measurement module failure detection and identification can be performed using any known or yet to be known techniques.

Figure 5:
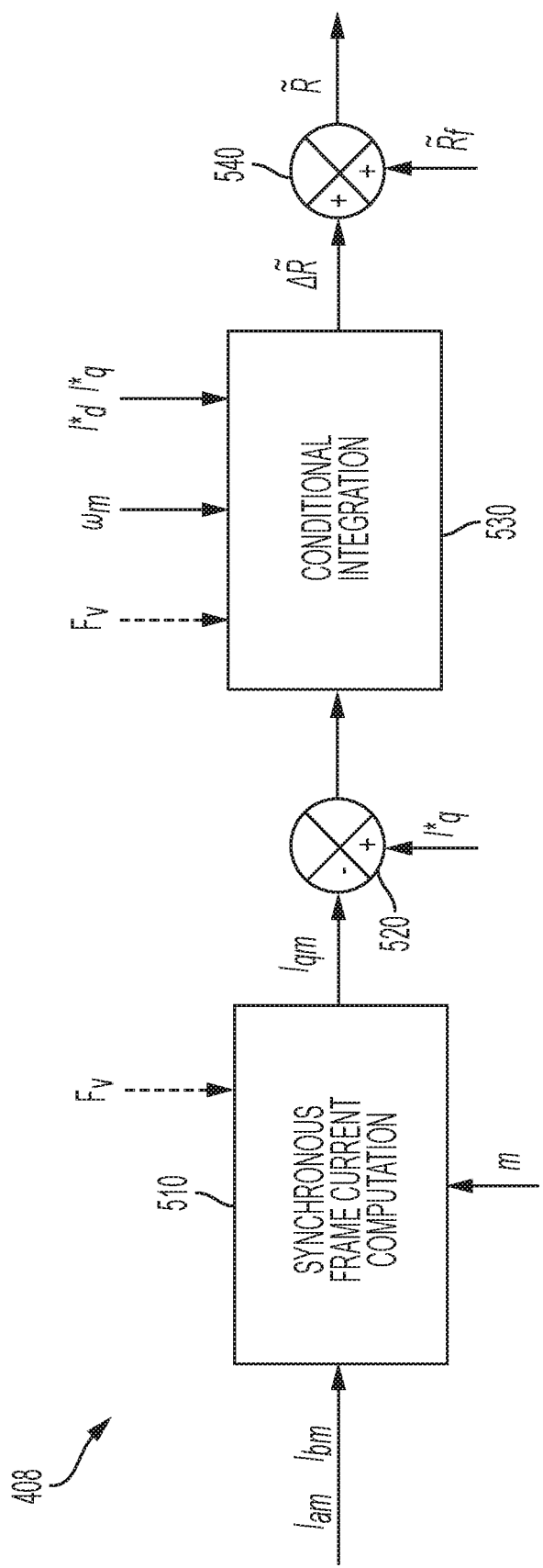
FIG. 5 depicts a block diagram of an example of how the parameter learning is implemented after current sensor fault detection and failed sensor identification in a motor control system with low side current measurement according to one or more embodiments.

FIG. 5 depicts a block diagram of an example of how the parameter learning is implemented after current sensor fault detection and failed sensor identification in a motor control system with low side current measurement according to one or more embodiments. In the depicted block diagram, $I_{am}$ and $I_{bm}$ are the phase a and b current measurements respectively, m is a modulation index which is the ratio of the magnitude of the final motor voltage command with respect to the DC link voltage, $F_v$ is a current measurement and calculation validity flag, $I_{qm}$ and $I_q^*$ are the measured and commanded q-axis currents respectively, $I_d^*$ is the command d-axis current, $\omega_m$ is the motor velocity, $\Delta\tilde{R}$ is the feedback resistance estimate, $R_f$ is the feedforward (model based) resistance estimate and $\tilde{R}$ is the final resistance estimate. In one or more examples, the modulation index is a number between 0-1 to represent the voltage command magnitude with respect to the DC link voltage. In such cases, the feedforward voltages, once converted to magnitude and phase, the ratio of the total (feedforward) voltage magnitude to the bridge voltage is represented by the modulation index.

The parameter estimation includes a synchronous frame q-axis current measurement calculation $I_{qm}$ at 510. This computation exemplifies a current measurement failure in phase c, which can be performed as follows:

$$I_{qm} = I_{am}\sin\theta + I_{bm}\sin\left(\theta - \frac{2\pi}{3}\right) + (-I_{am} - I_{bm})\sin\left(\theta + \frac{2\pi}{3}\right)$$

It should be noted that although the description herein uses a current sensor failure in phase c as an example, the technical solutions described herein can be used for current failures in the phase a or the phase b of the motor control system.

Because for low side current measurements, the assumption of $I_{cm} = -I_{am} - I_{bm}$ as made above is only valid for certain regions of operation, a current measurement and calculation validity flag $F_v$ is also computed. An example of how the calculation validity flag $F_v$ is performed is as follows.

$$F_v = \begin{cases} \text{VALID,} & m < m_t \\ \text{INVALID,} & m \geq m_t \end{cases}$$

where $m_t$ is the threshold of modulation index below which the current calculation is valid. The threshold is a predetermined value that can be configurable.

Depending on the validity indicated by the validity flag, a conditional integration is performed for estimating the machine parameters, such as the resistance $\tilde{R}$. Here, the computed $I_{qm}$ value is subtracted from the commanded q-axis current $I_q^*$ to compute the error in the computed value (at 520). The error is integrated (530) to compute the feedback parameter estimates, for example, the feedback resistance estimate $\Delta\tilde{R}$. The computed feedback parameter estimate is added (540) with the feedforward parameter estimate, for example feedforward resistance $R_f$. The computed sum is used as the final machine parameter estimate for further iteration, for example, the final resistance estimate $\tilde{R} = R_f + \Delta\tilde{R}$.

It should be noted that other machine parameters are computed in a similar manner, where the feedback parameter estimate is added with the feedforward parameter estimate based on the validity flag indicative of the valid condition to perform such computations.

When the validity flag is VALID, the low side current measurements in the phases a and b are used to compute the current for the phase c as $I_{cm} = -I_{am} - I_{bm}$. The computed current is then used by the machine parameter learning module 408. When the validity flag is INVALID, the machine parameter module stops the learning process because the computed current is not valid.

When validity flag is INVALID, the parameter is not learned in this manner, and the old learned value is retained. The "conditional" integration 530 is accordingly performing a "learning", and is based on when the error calculated itself is not valid, which is because the measured current is not valid, learning (or integration in this case) will not be valid, and the parameter value is not updated in such cases.

Accordingly, even when the current measurement system is not valid to perform feedback control, based on the validity flag calculation, and is forced to go to feedforward current control), the current measurement system can still be used perform other operations, one of which is parameter learning because that enhances the performance of feedforward current control. The parameter estimation can be performed in various ways, one of which is shown in FIG. 5. In the example technique of FIG. 5, it is first determined when it is appropriate/valid to use the "healthy measurements" to compute the q-axis current (which is in the synchronous frame). Thereafter, the q-axis current command and the q-axis measured (and valid under the given conditions) are unequal only when the parameters are incorrect. Next, a cause of the error in q-axis current is determined, for example, which parameter is causing the error. For instance, when the q-axis current is high but speed is low, the difference or error in q-axis current is deemed to be due to resistance estimation errors. Conditional integration 530, in one or more examples, is responsible for such computations and determinations. In one or more examples, the conditional integration performs this "learning" using one of many different techniques/logic/controllers. For example, the conditional integration 530 can use a PI controller whose input is the current error and output is the parameter estimate.

The above techniques improve the performance of the feedforward current control system and thus help in moving closer towards first fault transparency under a single point current sensor failure, especially in motor control systems that use low side current measurement.

Figure 6:
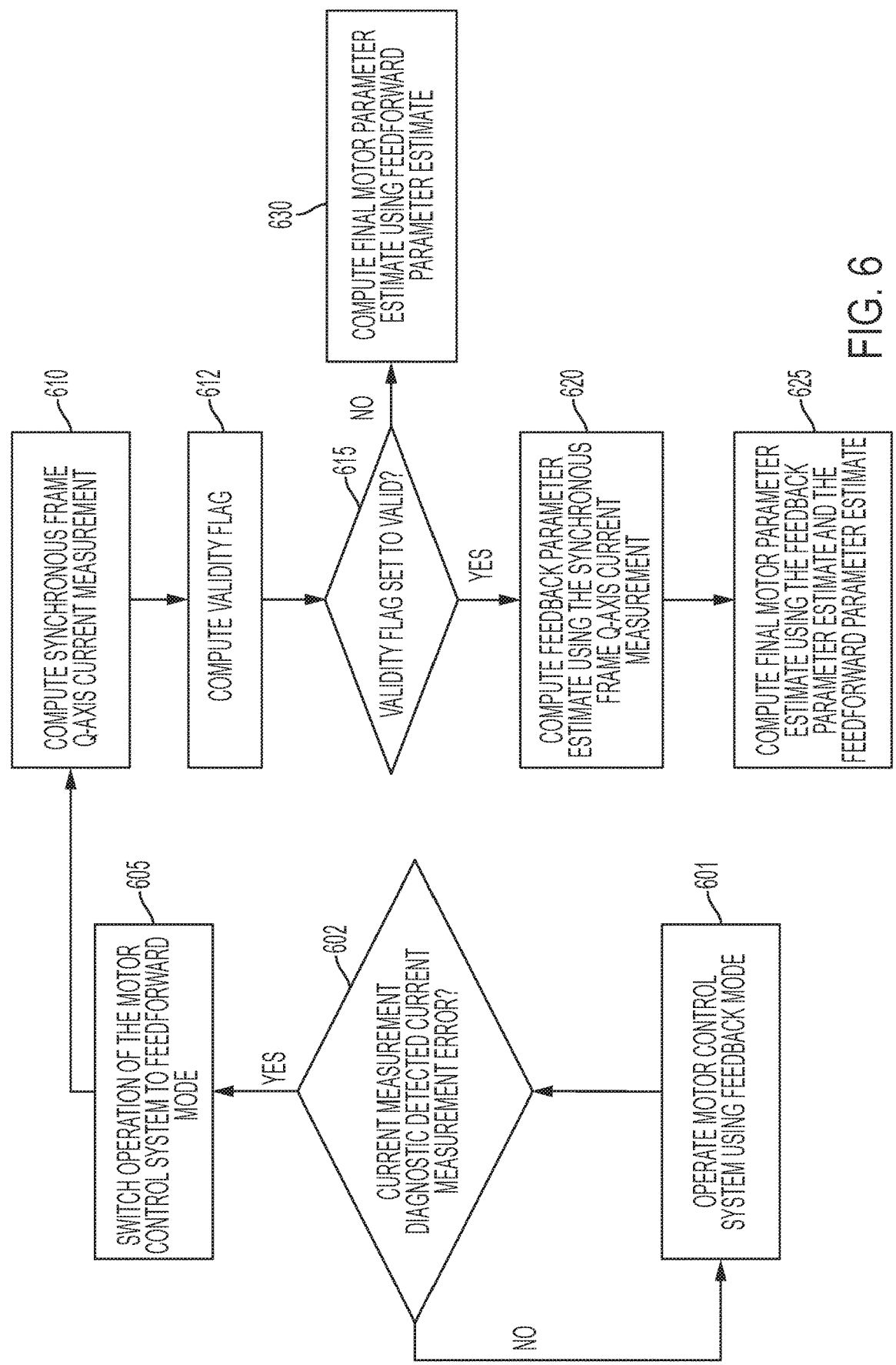
FIG. 6 depicts a flowchart for the method of operation of the motor control system in view of current sensor failure, the motor control system using a low side current measurement sensors according to one or more embodiments.

FIG. 6 depicts a flowchart for the method of operation of the motor control system in view of current sensor failure, the motor control system using a low side current measurement sensors according to one or more embodiments. The method includes operating the motor control system 100 using the feedback control mode, as shown at 601. The operation of the motor control system 100 continues until the current measurement calculation and diagnostic module 406 detects a current measurement error, as shown at 605. The current measurement error is detected based on the measured current values 124. If a current measurement error is detected, the motor control system 100 is switched to the feedforward operating mode, as shown at 610. In one or more examples, the current measurement calculation and diagnostic module 406 indicates the switch using a diagnostic flag or any other such indication to the current controller 404 to make the switch in the operating modes. The method further includes determining the failed component when operating in the feedforward mode, to determine which phase (a, b, c, or any other phase) has the failed component. In one or more examples, the method includes setting arbitration to use only healthy signals and not use current measurements from the failed component for the machine parameter learning 408.

The method further includes computing synchronous frame q-axis current measurement ($I_{qm}$) using the current measurements from the healthy phases (without failure), at 610. The computation is described herein. In addition, the validity flag ($F_v$) is determined, at 612. If the validity flag is set to INVALID, the machine parameter learning 408 using feedback parameter estimation is not performed, at 615. In such a case, the motor parameter estimate(s) are computed using feedforward parameter estimates, at 630. The estimated motor parameters include the motor and inverter parameters. For example, the resistance estimate is the total resistance of the inverter and motor together. Referring to the flowchart, if the validity flag is set to VALID, the machine parameter learning 408 proceeds to compute feedback parameter estimate using the synchronous frame q-axis current measurement, at 620. Further, the feedback parameter estimate is blended with a corresponding feedforward parameter estimate to compute the final machine parameter estimate, at 625.

Accordingly, the technical solutions described herein facilitate computing machine parameter estimates using feedback parameter estimates when the motor control system 100 is operating in feedforward control mode because of a current sensor failure, and particularly when the motor control system 100 uses low side current measurement. Accordingly, the technical solutions improve the performance of the feedforward current control system and thus help in moving closer towards first fault transparency under a single point current sensor failure.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate in scope with the present disclosure. Additionally, while various embodiments of the present disclosure have been described, it is to be understood that aspects of the present disclosure may include only some of the described embodiments or combinations of the various embodiments. Accordingly, the present disclosure is not to be seen as limited by the foregoing description.

Having thus described the present disclosure, it is claimed:

1. A system comprising:
a motor; and
a motor control system that comprises a low side current measurement subsystem, and a processor that is configured to:
switch the motor control system to use feedforward current control in response to detecting a current measurement failure in the low side current measurement subsystem;
identify a first phase that has a failed current measurement;
compute a current measurement for the first phase, which has the current measurement failure; and
compute a parameter estimate using the computed current measurement, wherein the parameter estimate is computed in response to a validity flag being set to VALID.

2. The system of claim 1, wherein the processor uses the feedforward current control to generate an input voltage command for the motor.

3. The system of claim 1, wherein the current measurement for the first phase is computed using the remaining phases in the motor control system.

4. The system of claim 1, wherein the parameter estimate is added to a feedforward machine parameter estimate to compute a machine parameter estimate.

5. The system of claim 1, wherein the validity flag is set based on a modulation index.

6. The system of claim 5, wherein the validity flag is set based on comparison of the modulation index with a predetermined threshold as:

$$F_v = \begin{cases} \text{VALID}, & m < m_t \\ \text{INVALID}, & m \geq m_t \end{cases},$$

wherein $F_v$ is the validity flag, m is the modulation index, and $m_t$ is the predetermined threshold.

7. A computer implemented method comprising:
switching a current controller to use feedforward current control in response to detecting a current measurement failure in a low side current measurement subsystem of a motor control system;
identifying a first phase that has the current measurement failure;
computing a current measurement for the first phase, which has the current measurement failure; and
computing a parameter estimate of the motor control system using the computed current measurement, wherein the parameter estimate is computed in response to a validity flag being set to VALID.

8. The method of claim 7, wherein the feedforward current control is used to generate an input voltage command for the motor.

9. The method of claim 7, wherein the current measurement for the first phase is computed using the remaining phases in the motor control system.

10. The method of claim 7, further comprising:
computing a machine parameter estimate by adding the parameter estimate to a feedforward machine parameter estimate.

11. The method of claim 7, wherein the validity flag is set based on a modulation index.

12. The method of claim 11, wherein the validity flag is set based on comparison of the modulation index with a predetermined threshold as:

$$F_v = \begin{cases} \text{VALID}, & m < m_t \\ \text{INVALID}, & m \geq m_t \end{cases},$$

wherein $F_v$ is the validity flag, m is the modulation index, and $m_t$ is the predetermined threshold.

13. A steering system comprising:
a motor control system that comprises a low side current measurement subsystem, and a processor that is configured to:
switch the motor control system to use feedforward current control in response to detecting a current measurement failure in the low side current measurement subsystem;
identify a first phase that has a failed current measurement;
compute a current measurement for the first phase, which has the current measurement failure; and
compute, in response to a validity flag being set to VALID, a parameter estimate using the computed current measurement.

14. The steering system of claim 13, wherein the current measurement for the first phase is computed using the remaining phases in the motor control system.

15. The steering system of claim 13, wherein the parameter estimate is added to a feedforward machine parameter estimate to compute a machine parameter estimate.

16. The steering system of claim 13, wherein the validity flag is set based on a modulation index.

17. The steering system of claim 16, wherein the validity flag is set based on comparison of the modulation index with a predetermined threshold as:

$$F_v = \begin{cases} \text{VALID}, & m < m_t \\ \text{INVALID}, & m \geq m_t \end{cases},$$

wherein $F_v$ is the validity flag, m is the modulation index, and $m_t$ is the predetermined threshold.

* * * * *